United States Patent [19]

Kawanabe

[11] 4,274,060
[45] Jun. 16, 1981

[54] SIGNAL CHANGE-OVER AMPLIFIER

[75] Inventor: Yoshihiro Kawanabe, Tokyo, Japan

[73] Assignee: Pioneer Electronic Corporation, Tokyo, Japan

[21] Appl. No.: 93,561

[22] Filed: Nov. 13, 1979

[30] Foreign Application Priority Data

Nov. 15, 1978 [JP] Japan .......................... 53/156836[U]

[51] Int. Cl.³ .......................... H03F 3/68; H03F 3/45
[52] U.S. Cl. .................................... 330/295; 330/51; 330/252; 330/255
[58] Field of Search ................... 330/51, 69, 252, 295, 330/255; 307/243; 328/154; 455/142, 143, 144

[56] References Cited

U.S. PATENT DOCUMENTS 3,904,977  9/1975  Barsotti .............................. 330/51

Primary Examiner—James B. Mullins
Assistant Examiner—Gene Wan
Attorney, Agent, or Firm—Sughrue, Rothwell, Mion, Zinn and Macpeak

[57] ABSTRACT

A signal change-over amplifier for an FM receiver for switching over between AM and FM receiving modes without the addition of frequency response distortion or pop noise. The amplifier circuit includes two input signal control sections each of which includes a differential transistor pair. Activating current is fed to the emitters of the differential transistor pairs by a constant current source which is activated in response to the input control signal. The collectors of the transistor of the two input control sections are interconnected. The base of one transistor of one pair is coupled to the base of the corresponding transistor of the other pair. The input information-bearing signals are coupled to the bases of the other transistors in the two pairs. The interconnected collectors are coupled respectively to a transistor pair in an output section to which current is fed by a current mirror circuit. The final output is provided by a push-pull circuit. Feedback is provided between the output section and the two input sections through a resistor pair coupled between the output terminal of the push-pull pair and the interconnected bases of the input signal control sections.

4 Claims, 2 Drawing Figures

SIGNAL CHANGE-OVER AMPLIFIER

BACKGROUND OF THE INVENTION

This invention relates to a signal change-over amplifier adapted for use in audio equipment in which signal receiving bands are switched.

When a band switching operation is performed in audio equipment between, for example, an AM receiving mode and an FM receiving mode, a signal change-over amplifier has customarily been used for alternatively selecting one of the audio signals delivered from the AM and FM receiving sections in response to the output from a band change-over switch.

Heretofore, various kinds of such signal change-over amplifiers have been proposed. However, those known previously have suffered from numerous disadvantages such as increased distortion, undesirable frequency characteristics, and introduction of noise of such as pop noise which is produced at the time of band change-over.

SUMMARY OF THE INVENTION

Accordingly, an object of this invention is to provide an improved signal change-over amplifier eliminating the aforementioned disadvantages accompanying the prior art amplifiers of this type. The signal change-over amplifier according to this invention is low in distortion and has a wide frequency range. Further, no pop noise is produced at the time of band change-over.

This, as well as other objects of the invention, may be met by a signal change-over amplifier for selectively amplifying one input signal among plural input signals including a plurality of input signal control sections with one of the control sections being provided for each of the input signals and an output section having an output terminal to which is coupled a selected input signal from one of the input signal control sections. The input control sections are each subjected to ON-OFF control in response to corresponding input control signals. Each of the input signal control sections includes a first transistor having an emitter, a base and a collector with the base coupled to receive one of the input signals. A second transistor having an emitter, a base and a collector has the emitter thereof commonly connected to the emitter of the first transistor so that the two transistors are coupled in a differential circuit arrangement. A constant current source is connected so as to supply current to the commonly connected emitters of the first and second transistors. The constant current source is activatable by a corresponding input control signal so as to supply current when the control signal is in its active state. The output section includes third and fourth transistors with the bases of the third and fourth transistors connected respectively to the collectors of the first and second transistors of the control sections. Current producing means is provided with an input terminal connected to the collector of the fourth transistor of the output section and an output terminal connected to the collector of the third transistor. A push-pull circuit is connected at its input to the output terminal of the current producing means.

There may further be provided a feedback resistor circuit which is coupled between an output terminal of the push-pull circuit and the commonly connected bases of the second transistors of the control section. The push-pull circuit is constructed with an NPN transistor and a PNP transistor wherein the emitters of the respective transistors are coupled to each other. The output signal from the push-pull circuit is taken from the commonly connected emitters.

In a preferred embodiment, the constant current source includes a fifth transistor having a base to which the control signal is coupled, an emitter coupled to ground, and a collector coupled through a series combination of a first resistor, a diode and a second resistor to a voltage source. A sixth transistor is coupled thereto with its base coupled to the juncture point between the first resistor and the diode and with its emitter coupled through a resistor to the voltage source. The collector of the sixth transistor forms the output terminal of the current source. Also in the preferred embodiment, the current producing means includes seventh and eighth transistors coupled in a current mirror circuit.

DETAILED DESCRIPTION OF THE PREFERRED EMBODIMENT

This invention will now be described with reference to the accompanying drawings.

Figure 1:
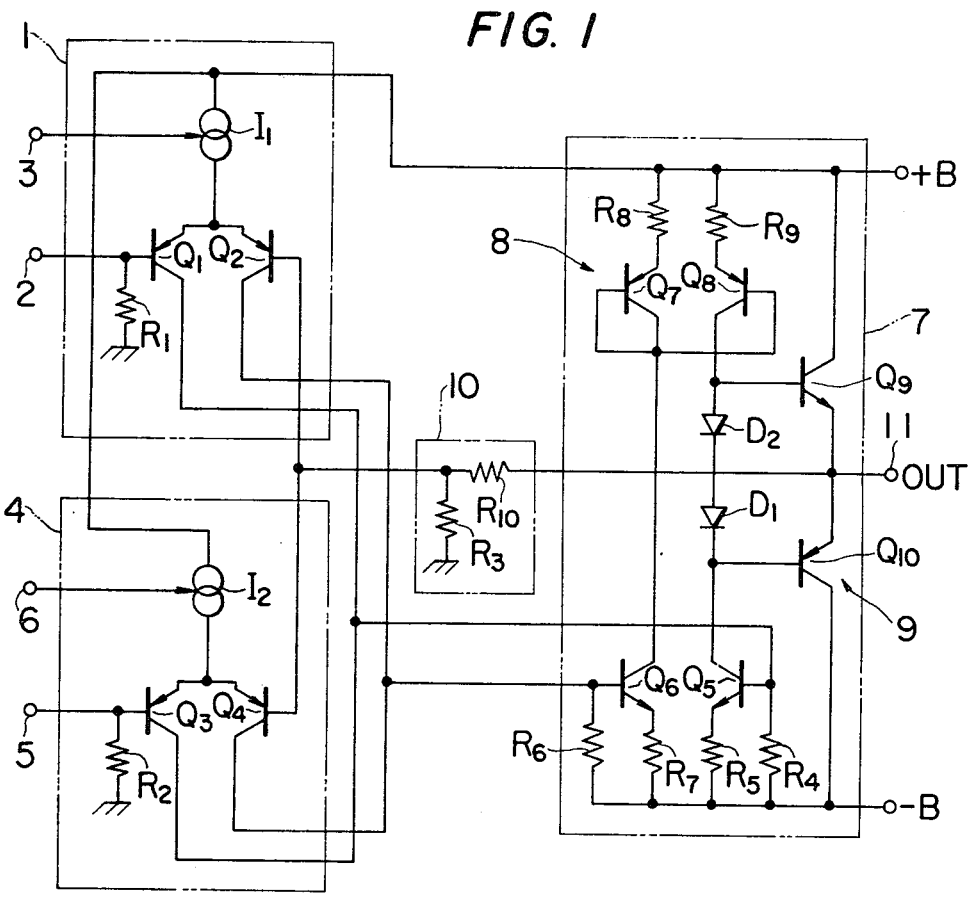
FIG. 1 is a circuit diagram showing an embodiment of a signal change-over amplifier according to the present invention.

FIG. 1 is a circuit diagram showing an embodiment of a signal change-over amplifier according to the invention. In this figure, first control section 1 for controlling a first input signal, such as an audio signal delivered from an AM receiving section operates to couple through the first input signal applied to an input terminal 2 in response to a control signal applied to a terminal 3 from a band change-over switch (not shown). The first control section 1 includes a pair of first and second transistors $Q_1$ and $Q_2$ whose emitters are commonly connected to each other in a differential circuit. A constant current source $I_1$ is connected to the emitter juncture point of the first and the second transistors $Q_1$ and $Q_2$. The base of the first transistor $Q_1$ is connected to the input terminal 2 and is connected through a resistor $R_1$ to ground.

Second control section 4 for controlling a second input signal such as an audio signal delivered from an FM receiving section, operates to couple through the second input signal applied to an input terminal 5 in response to a control signal applied to a terminal 6 from the band change-over switch. The circuit arrangement of the second control section 4 is similar to that of the first control section 1. That is, first and second transistors $Q_3$ and $Q_4$ are provided with the emitters of the respective transistors commonly connected in a differential circuit arrangement. A constant current source $I_2$ is connected to the emitter juncture point of the first and the second transistors $Q_3$ and $Q_4$. The base of the first transistor $Q_3$ is connected to the input terminal 5 and through a resistor $R_2$ to ground.

The bases of the second transistors $Q_2$ and $Q_4$ in the first and the second control circuits 1 and 4 are commonly connected to each other and are grounded through a resistor $R_3$. The collectors of the first transistors $Q_1$ and $Q_3$ as well as the collectors of the second transistors $Q_2$ and $Q_4$ are commonly connected. The respective collector juncture points of the first and the second transistors are connected to input terminals of an output section 7.

The output section 7 includes third transistor $Q_5$ having a base connected to the collector juncture point of the first transistors $Q_1$ and $Q_3$ and fourth transistor $Q_6$ having a base connected to the collector juncture point of the second transistors $Q_2$ and $Q_4$. The base and the emitter of the transistor $Q_5$ are connected to a negative voltage source-B through resistors $R_4$ and $R_5$, respectively, while the base and the emitter of the transistor $Q_6$ are connected to the same source through resistors $R_6$ and $R_7$, respectively. The collector of the transistor $Q_6$ is connected to the input terminal of a current mirror circuit 8 and the collector of the transistor $Q_5$ is connected to the output terminal thereof via diodes $D_1$ and $D_2$. The current mirror circuit 8 operates as current producing circuit.

The current mirror circuit 8 includes transistors $Q_7$ and $Q_8$ whose emitters are connected to a positive voltage source $+B$ through resistors $R_8$ and $R_9$, respectively. The collector and the base of the transistor $Q_7$, which interconnected to function as a diode junction, form the input terminal of the current mirror circuit 8 while the collector of the transistor 8 forms the output terminal thereof. The output of the current mirror circuit 8 is coupled to a push-pull circuit 9 including a pair of transistors $Q_9$ and $Q_{10}$ of opposite polarity types. The emitters of the transistors $Q_9$ and $Q_{10}$ are commonly connected to each other and the bases thereof are connected through the diodes $D_1$ and $D_2$. The emitter juncture point of the transistors $Q_9$ and $Q_{10}$ is connected to the base juncture point of the second transistors $Q_2$ and $Q_4$ through a feedback circuit 10 including a resistor $R_{10}$ and the resistor $R_3$ of which one terminal is grounded. The emitter juncture point of the transistors $Q_9$ and $Q_{10}$ also is connected to an output terminal 11.

Figure 2:
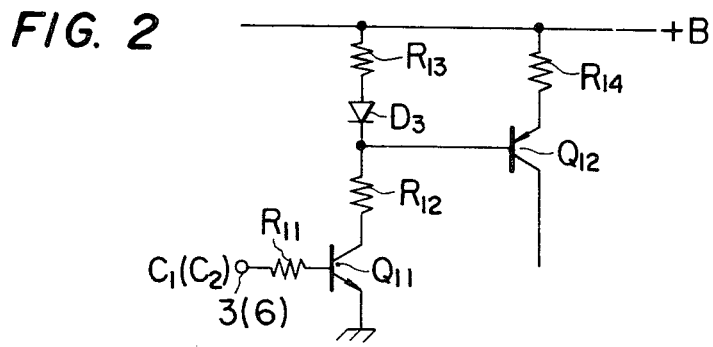
FIG. 2 is a circuit diagram showing an example of a constant current source used in the circuit shown in FIG. 1.

FIG. 2 is a circuit diagram showing an example of the constant current sources $I_1$ and $I_2$ employed in the first and the second control circuits 1 and 4 shown in FIG. 1. In this circuit, a transistor $Q_{11}$ is provided in which the base is connected through a resistor $R_{11}$ to the terminal 3 or 6, the emitter is directly grounded, and the collector is connected through a resistor $R_{12}$, a diode $D_3$ and a resistor $R_{13}$ to the positive voltage source $+B$. To the juncture point of the resistor $R_{12}$ and the diode $D_3$, the base of a transistor $Q_{12}$ is connected. The emitter of the transistor $Q_{12}$ is connected through a resistor $R_{14}$ to the positive voltage source $+B$.

In the thus constructed signal switching amplifier, in the case that the constant current source $I_1$ is rendered in the ON state while the constant current source $I_2$ is rendered in the OFF state in response to the control signals applied to the terminals 3 and 6, the first control section 1, the output section 7 and the feedback section 10 together constitute a negative feedback amplifier. In this case, the input signal applied to the terminal 2 is obtained at the output terminal 11 as an output signal of the amplifier. The input signal applied to the terminal 5 does not appear at the output terminal 11 since the transistors $Q_3$ and $Q_4$ in the second control section 4 are in the OFF state due to the fact that no current is supplied from the constant current source $I_2$ to the commonly-connected emitters of the transistors $Q_3$ and $Q_4$. On the other hand, when the constant current source $I_1$ is in the OFF state while the constant current source $I_2$ is in the ON state, the input signal applied to the terminal 2 does not appear at the output terminal 11. In the absence of control signals applied to either of the terminals 3 and 6, both the constant current sources $I_1$ and $I_2$ are in the OFF state so that the first and second control sections 1 and 4 and all the transistors in the output section 7 are rendered OFF. Accordingly, neither of the input signals applied to the terminals 2 and 5 appears at the output terminal 11. The currents flowing into the transistors $Q_5$ and $Q_6$ in the output circuit 7 are maintained in a balanced condition due to the current mirror circuit 8 so that no pop noise is produced at the time of band change-over.

In the above-described signal change-over amplifier, when either the first control section 1 or the second control section 4 is in an operative mode, a negative feedback amplifier with a large open-loop gain is provided in the signal path so that the output signal obtained at the output terminal 11 has little distortion and has a wide frequency range. Furthermore, according to the invention, the gain of the amplifier circuit may be set to a desired level by the values of the resistors of the feedback circuit 10.

In the embodiment described, description has been given in which selection between two input signals is carried out. It is, however, possible to modify the circuit so that the circuit is capable of receiving more than two input signals by the addition of further control sections. Furthermore, since all the transistors in the output circuit 7 are rendered OFF when all the constant current sources are OFF it is possible to increase the number of input terminals by employing additional ones of the circuits shown in FIG. 1 and interconnecting the respective output terminals of the circuits.

As described, according to the signal change-over amplifier of the invention, the output signal is essentially free of distortion, the frequency band range is wide and the frequency characteristics are quite flat. Furthermore, no pop noise is produced when no input signal is present because the output section is simultaneously rendered OFF. In addition, the circuit is advantageous in that it can be constructed so as to receive as many input signals as desired.

What is claimed is:

1. A signal change-over amplifier for selectively amplifying one input signal among a plurality of input signals comprising: a plurality of input signal control sections, each of said control sections being provided for each of said input signals; an output section having an output terminal to which is coupled a selected input signal, said input signal control sections being subjected to ON-OFF control in response to corresponding control signals, each of said input signal control sections including a first transistor having an emitter, a base and a collector, the base of said first transistor being coupled to receive one of said input signals; a second transistor having an emitter, a base and a collector, the emitter of said second transistor being commonly connected to the emitter of said first transistor so that said first and said second transistors are coupled in a differential circuit; a constant current source connected to supply current to the commonly connected emitters of said first and said second transistors, said constant current source being activatable in response to the corresponding control signal; said collectors and bases of said second transistor and said collector of said first transistor of each of said control input sections being respectively interconnected; and said output section including third and fourth transistors each having a base and a collector, the bases of said third and fourth transistors being respectively connected to the collectors of said first and said second transistors of said control sections; current producing means having input and output terminals respectively connected to the collectors of said fourth and said third transistors; and a push-pull circuit connected to the output terminal of said current producing means.

2. The signal change-over amplifier of claim 1 further comprising feed-back resistor means connected between an output terminal of said push-pull circuit and the base of said second transistors of said control section.

3. The signal change-over amplifier of either claim 1 or 2 wherein said constant current source comprises: a fifth transistor having a base to which said control signal is coupled, an emitter coupled to ground, and a collector coupled through a series combination of a first resistor, a didoe and a second resistor to a voltage source and a sixth transistor having a base coupled to the juncture between said first resistor and said diode and an emitter coupled through a resistor to said voltage source, a collector of said sixth transistor forming the output terminal of said current source.

4. The signal change-over amplifier of either claim 1 or 2 wherein said current producing means comprises seventh and eighth transistors connected in a current mirror circuit.

* * * * *